(12) United States Patent
Denzler et al.

(10) Patent No.: US 7,490,753 B2
(45) Date of Patent: Feb. 17, 2009

(54) METHOD FOR PRODUCING ELECTRICAL CONTACTING OF A PIEZOELECTRIC ACTUATOR AND POLARIZATION OF THE PIEZOELECTRIC ACTUATOR

(75) Inventors: Michael Denzler, Regensburg (DE); Bernd Döllgast, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 512 days.

(21) Appl. No.: 10/567,995

(22) PCT Filed: Aug. 11, 2004

(86) PCT No.: PCT/EP2004/051775

§ 371 (c)(1),
(2), (4) Date: Feb. 10, 2006

(87) PCT Pub. No.: WO2005/022657

PCT Pub. Date: Mar. 10, 2005

(65) Prior Publication Data

US 2006/0208039 A1    Sep. 21, 2006

(30) Foreign Application Priority Data

Aug. 21, 2003   (DE) .................. 103 38 486

(51) Int. Cl.
*B23K 31/00* (2006.01)
*H01L 41/22* (2006.01)

(52) U.S. Cl. .............. 228/119; 228/120; 29/25.35; 29/860; 310/311; 310/328

(58) Field of Classification Search ............. 228/119; 29/23.35, 860; 310/311, 328
See application file for complete search history.

(56) References Cited

U.S. PATENT DOCUMENTS

| 5,196,756 | A | * | 3/1993 | Kohno et al. ............. 310/328 |
| 5,325,012 | A | | 6/1994 | Sato et al. ............... 310/364 |
| 6,307,306 | B1 | | 10/2001 | Bast et al. ............... 310/366 |
| 6,747,398 | B2 | | 6/2004 | Nakatani ................. 310/328 |

FOREIGN PATENT DOCUMENTS

| DE | 199 30 585 A1 | 2/2000 |
| DE | 199 45 933 C1 | 5/2001 |
| DE | 100 26 635 A1 | 1/2002 |
| DE | 102 31 929 A1 | 3/2003 |
| EP | 0 350 941 A2 | 7/1989 |
| WO | WO 02/073656 A2 | 9/2002 |

OTHER PUBLICATIONS

Search Report and Written Opinion (with English language supplemental sheet); PCT/EP2004/051775; 15 Pgs Nov. 2004.

* cited by examiner

*Primary Examiner*—Kiley Stoner
*Assistant Examiner*—Nicholas P D'Aniello
(74) *Attorney, Agent, or Firm*—Baker Botts L.L.P.

(57) ABSTRACT

A method for creating a soldered joint to contacts of a piezoelectric actuator and polarizing the piezoceramic layers of the piezoelectric actuator has the steps of Polarization and soldering of the joint which are performed simultaneously such that the duration of the process is reduced.

20 Claims, 3 Drawing Sheets

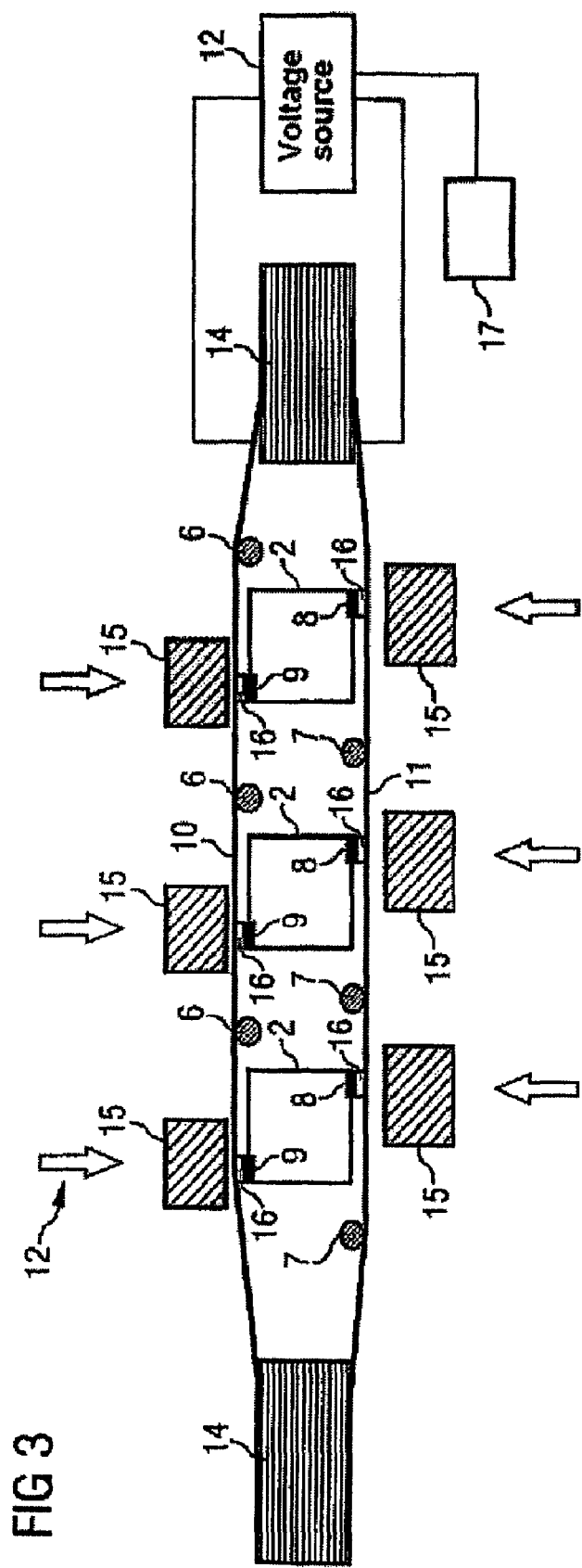

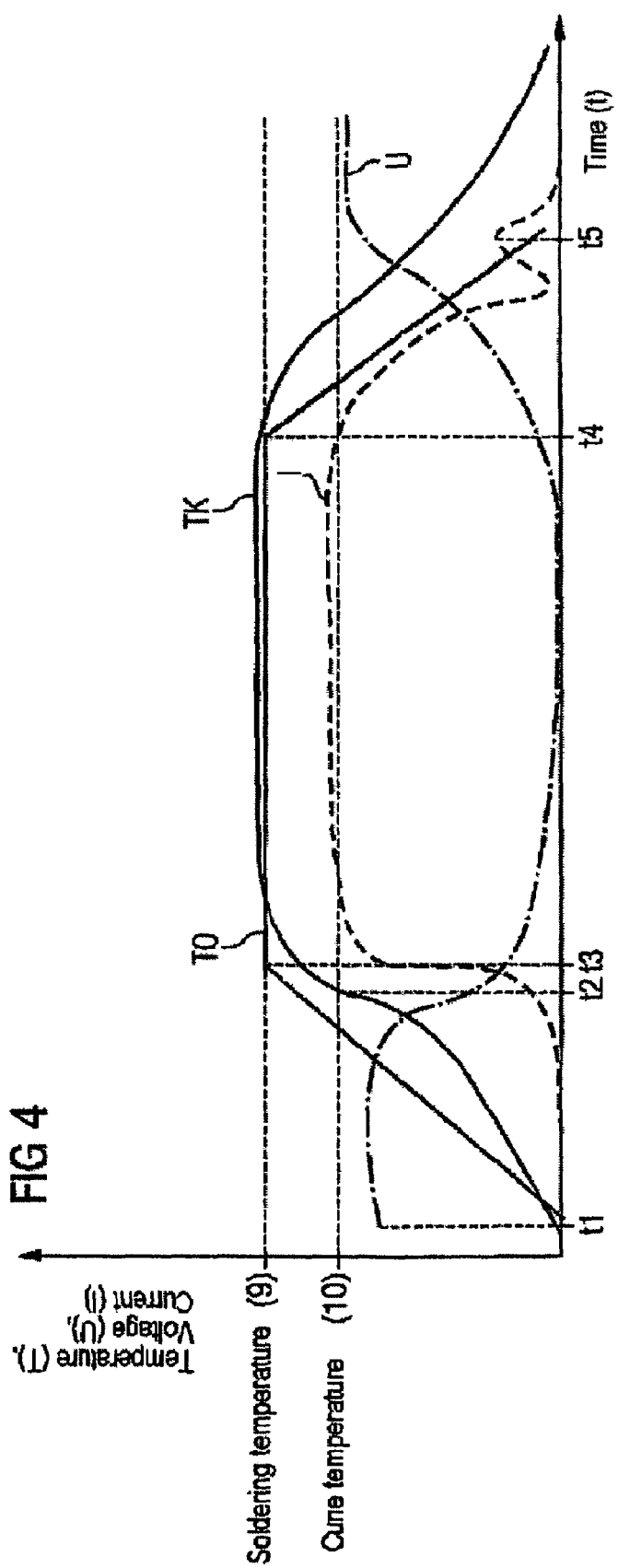

METHOD FOR PRODUCING ELECTRICAL CONTACTING OF A PIEZOELECTRIC ACTUATOR AND POLARIZATION OF THE PIEZOELECTRIC ACTUATOR

CROSS-REFERENCE TO RELATED APPLICATIONS

This application is a U.S. national stage application of International Application No. PCT/EP2004/051775 filed Aug. 11, 2004, which designates the United States of America, and claims priority to German application number DE103384863.3 filed Aug. 21, 2003, the contents of which are hereby incorporated by reference in their entirety.

TECHNICAL FIELD

The invention relates to a method for producing electrical contacting of a piezoelectric actuator and a method for polarizing the piezoelectric actuator.

BACKGROUND

Piezoelectric actuators generally consist of collectively sintered stacks of piezoceramic layers with interposed metal electrodes. Every second metal electrode is brought out on a first side and connected to a first metallization path. On the opposite side there is provided a second metallization path which is connected in an electrically conducting manner to the other metal electrodes, thereby providing two metal electrode arrangements which are electrically isolated from one another.

During operation of the piezoelectric actuators, large forces but only small relative displacements are attained, parallel to a polarization direction of the piezoceramic layers. To achieve low operating voltages, the piezoelectric actuator consists of a plurality of piezoceramic layers. To polarize the actuator, an electric polarization field is applied to the two electrode structures, thereby producing a maximum remanent polarization and an ordered distribution of the domains oriented in field direction in the crystals of the ceramic layers compared to an unpolarized initial state. Polarization is performed at a piezoceramic layer temperature above the Curie temperature of the piezoceramic layer.

For electrical contacting of the piezoelectric actuator, it is additionally necessary to contact the metallization paths to electric conductors. For this purpose the electric conductors are permanently soldered to the metallization paths in a soldering process.

European patent application EP 0 350 941 A2 discloses a piezoelectric actuator and a method for manufacturing the piezoelectric actuator which is designed in the form of a plurality of piezoceramic layers, an electrode being disposed between each of the piezoceramic layers. Every second electrode is connected in an electrically conducting manner to a metallization path which is disposed on the outside of the piezoelectric actuator. The other electrodes are connected in an electrically conducting manner to a second metallization path which is disposed opposite the first metallization path on the outside of the piezoelectric actuator. For a connection process, the piezoelectric actuator is heated above the Curie temperature so that a chemical bond is formed between the electrodes and the piezoceramic layers. In a following cooling process, polarization of the piezoceramic layers is performed, the temperature of the piezoceramic layers still being above the Curie temperature. In a subsequent soldering process, electric conductors are soldered to the metallization paths.

German patent application DE 100 26 635 A1 describes a method for producing a soldered joint between an electrical contact area of a piezoceramic actuator and a wire surface, wherein metallization strips of the piezoelectric actuator are soldered to wires disposed in parallel. Soldering takes place after polarization of the piezoceramic actuator. During the soldering process, the piezoceramic actuator is at a temperature below the Curie temperature.

SUMMARY

The object of the invention is to provide a method for producing electrical contacting of a piezoelectric actuator and a method for polarizing the piezoelectric actuator that can be carried out more quickly.

The object of the invention is achieved by a method for producing electrical contacting of a piezoelectric actuator and for polarizing the piezoelectric actuator, the method comprising the steps of providing an actuator having at least one piezoceramic layer which has two spaced electric contacts, soldering electric conductors to the electric contacts, and heating the piezoelectric actuator up to a soldering temperature during the soldering process, wherein during the soldering process a polarizing voltage is applied to the conductors and the piezoceramic layer is polarized.

A solder material can be used whose soldering temperature is above the Curie temperature of the piezoceramic layer. The polarizing voltage can also be applied during a cooling process, and the voltage can be limited to a maximum value during cooling of the actuator. The polarizing voltage can be applied during a heating process before a maximum temperature is reached, and the current can be limited to a maximum value during heating of the actuator. The voltage present during polarization can be recorded and evaluated in order to assess the polarization and/or the actuator. The current flowing during polarization can be recorded and evaluated in order to assess the polarization and/or the actuator. The conductors can be pressed onto soldering surfaces of the contacts via heating blocks, and the heating can block at least partially heat up the actuator. A plurality of actuators can be soldered to conductors and can be polarized simultaneously. The conductors of a contact can be used monolithically for a plurality of actuators during soldering and polarization, and after soldering and polarization the conductors can be divided into individual conductor pieces for each actuator. The conductors can be connected to contact pins prior to soldering and polarization. The actuator can be heated up to above the Curie temperature of the piezoceramic layer during the soldering process.

The advantage of the method is that the electrical contacting of the piezoelectric actuator and the polarizing of the piezoelectric actuator can be performed in a shorter time. This advantage is achieved by performing the electrical contacting and polarization at least partly simultaneously. The soldering process is preferably carried out above the Curie temperature and the polarization of the piezoceramic layers of the actuator is performed at the same time.

In an advantageous development of the method according to the invention, the polarizing voltage is also applied during a cooling phase to below the Curie temperature and limited to a maximum value, thereby ensuring on the one hand that the polarization is reliably retained and, on the other, avoiding damaging the piezoceramic layers.

In a further embodiment of the method according to the invention, the polarizing voltage is applied even before a maximum temperature is attained and the current flowing is limited to a maximum value during the heating of the actuator.

This means that polarization is achieved even before reaching the maximum temperature of the piezoelectric actuator and at the same time damage to the piezoceramic layers is reliably avoided by limiting the current to a maximum value. In a further preferred embodiment, the voltage applied during polarization is recorded and evaluated in order to be able to gauge the quality of the polarization or the quality of the piezoelectric actuator.

In a further preferred embodiment, the current flowing during polarization is recorded and evaluated in order to assess the polarization and/or the piezoelectric actuator.

In a preferred embodiment, the conductors are pressed onto soldering surfaces of the contacts via heating blocks, the heating blocks at least partially heating the actuator. In this way the soldering process is facilitated by the mechanical pressing-on of the conductors and, in addition, the temperature is applied in the region of the soldered joint, thereby achieving an improvement in the soldering process.

In another advantageous embodiment, a plurality of actuators are simultaneously soldered to conductors and polarized, thereby achieving an efficient implementation of the method so that mass production is possible.

BRIEF DESCRIPTION OF THE DRAWINGS

The invention will now be explained in greater detail with reference to the accompanying drawings, in which:

FIG. 3 schematically illustrates an arrangement for implementing the method according to the invention; and FIG. 4 shows a timing diagram for the various parameters during implementation of the method according to the invention.

DETAILED DESCRIPTION

Figure 1:
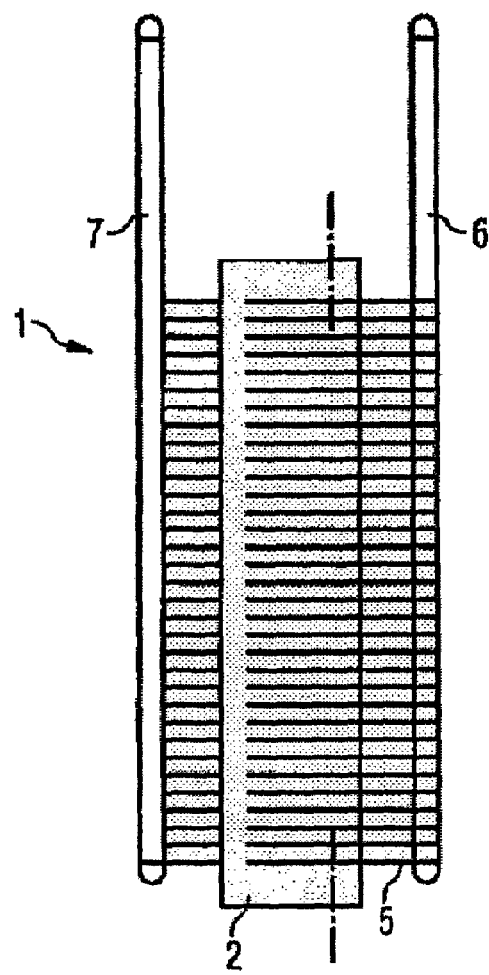
FIG. 1 shows a piezoelectric actuator.
Figure 2:
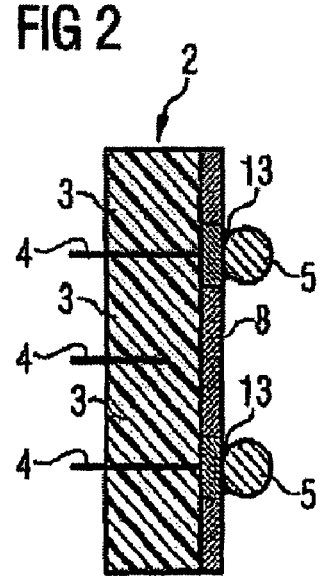
FIG. 2 shows a cross-section through an edge region of the piezoelectric actuator after the soldering process.

FIG. 1 schematically illustrates a piezoceramic actuator 1 having a piezoceramic component 2 with a plurality of piezoceramic layers 3 (FIG. 2). Between every two layers 3 there is formed a planar electrode 4 (FIG. 2). The electrodes 4 are connected in an electrically conducting manner via wires 5 to a first or a second contact pin 6, 7. Every second electrode 4 is connected in an electrically conducting manner via a wire 5 to the first contact pin 6. The other electrodes 4 are connected in an electrically conducting manner via wires 5 to the second contact pin 7. In this way a layer structure is implemented wherein each piezoceramic layer 3 is bounded by two electrodes 4 which are connected in an electrically conducting manner to different contact pins 6, 7. By applying different voltage potentials to the first and the second contact pin 6, 7, all the piezoceramic layers 3 are subject to the same voltage, so that the layers 3 expand according to the voltage applied.

FIG. 2 shows a partial cross-section of an edge region of the piezoceramic component 2. On the piezoceramic component there is deposited a first metallization path 8. The first metallization path 8 is connected in an electrically conducting manner to every second electrode 4. Opposite the first metallization path 8 there is disposed on the other side of the component 2 a second metallization path 9 which is connected in an electrically conducting manner to the other electrodes 4. The metallization path 8 is connected to the wires 5 in an electrically conducting manner via a solder coating 13. The wires 5 of the first metallization path 8 are routed to the first contact pin 6.

In a corresponding manner, the second metallization path 9 is connected in an electrically conducting manner via wires 5 to the second contact pin 7.

FIG. 3 shows a schematic arrangement for carrying out the method according to the invention.

For manufacturing the piezoelectric actuator 1, the layers 3 and the electrodes 4 are first produced in a sintering process. It is additionally necessary to perform polarization of the piezoceramic layers 3. For this purpose a polarizing voltage is applied to the layers 3 via the electrodes 4, the piezoceramic layers 3 having a temperature exceeding the Curie temperature of the piezoceramic layers 3. It is additionally necessary to connect electric conductors 10, 11 to the metallization paths 8, 9.

In the method according to the invention, three piezoelectric components 2 are disposed in the embodiment shown. The components 2 already possess the piezoceramic layers 3, the electrodes 4 and the metallization paths 8, 9. The metallization paths 8, 9 are disposed on opposite sides and at diametrically opposed corner regions of the component 2 which is implemented with a square cross-section. First and second conductors 10, 11 are placed on the first and second metallization path 8, 9. The first and the second conductors 10, 11 are implemented in the form of wires and connected in an electrically conducting manner to a voltage source 12. The ends of the conductors 10, 11 are in stand-off blocks 14.

The components 2 are heated up to a temperature which is above the Curie temperature of the piezoelectric layers 3. The conductors 10, 11 are then pressed against the first and second metallization path 8, 9. In addition, solder 13 is inserted between the first and the second metallization path and the first and second conductor 10, 11. Solder 13 having a soldering temperature above the Curie temperature is used as solder material. Heating elements 15 are preferably used for pressing on the first and the second conductor 10, 11 and, in addition to pressing against the first and the second conductor 10, 11, at least partially heat up the component 2 at the same time. In a preferred embodiment, the solder 13 is inserted in the form of a solder foil 16 between the metallization paths 8, 9 and the first and second conductors 10, 11.

Simultaneously with the soldering process, a polarizing voltage is applied to the conductors 10, 11 via the voltage source 12, thereby causing the piezoelectric layers 3 to be polarized. For polarization, field strengths of 1 to 2 kV/mm are used. The current values employed are a few $A/cm^2$. The polarization is preferably applied even before the maximum temperature of the component 2 is reached. In addition, the polarizing voltage is preferably maintained when the component 2 cools down from the maximum temperature to below the Curie temperature. To ensure that the current intensity does not exceed the maximum current during heating of the component 2, the current intensity is limited to a maximum value by the voltage source 12. At the same time, the voltage present is limited to a maximum value by the voltage source 12 when the component 2 is cooled down in order to ensure that the piezoceramic layers 3 are not damaged.

The conductors 10, 11 are or will be soldered to the first or second contact pins 6, 7. After the soldering and polarizing process, the conductors 10, 11 are separated to produce individual actuators 1 according to FIG. 1.

FIG. 4 shows a timing diagram for the polarization voltage U and the polarization current I. Also given in the diagram are the temperature TO on the surface of the metallization paths 8, 9 and the temperature TK of the piezoceramic layers 3. The Curie temperature for the piezoelectric layers 3 and the soldering temperature for the soldering material used have been entered on the diagram. The characteristics have been plotted over time t in the diagram.

At the start of the polarization and soldering process, the conductors 10, 11 are pressed against the metallization paths 8, 9, the component 2 is not yet heated up and the voltage source 12 has not yet applied a polarizing voltage.

At a first instant t1 the polarizing voltage U is applied. The components 2 are simultaneously heated up via the heating blocks 15. At a second instant t2 the temperature TK of the piezoceramic layer 3 reaches the Curie temperature. As the temperature rises, the conductivity of the piezoceramic layers 3 increases so that the current I rises and the voltage U falls. At a third instant t3 the surface temperature TO of the components 2 reaches the soldering temperature so that the soldering process commences. The soldering temperature is higher than the Curie temperature. At a fourth instant t4 the soldering process is complete and the heating blocks 15 are switched off so that the component 2 cools down. During the time period between the third instant t3 and the fourth instant t4 the maximum current flowing is limited. After the fourth instant t4 both the surface temperature TO and the temperature TK of the piezoceramic layer 3 begin to fall. The reduction in temperature causes the resistance of the piezoceramic layers 3 to increase so that the voltage U increases again. The voltage source 12 ensures that the polarization voltage U does not exceed a maximum value. Appropriate voltage regulation is provided for this purpose in the voltage source 12.

Below the Curie temperature there is produced at a fifth instant t5 a charge pulse which is reflected in a transient increase in the current intensity I. the charge pulse can be used to assess the piezoelectric actuator 1. The charge pulse is preferably compared with a reference charge pulse. If the measured charge pulse exceeds or undershoots the reference charge pulse by a specified value, the piezoelectric actuator is identified as defective. In another preferred embodiment, reference curves for the polarization voltage during the polarization and soldering process are stored in a control unit 17. The control unit 17 compares the voltage curve and/or the current curve present during the soldering and polarization process with the stored voltage curve or the stored current curve. On the basis of the comparison it is possible to assess the quality of the polarization and/or the quality of the piezoelectric actuator 1. If the measured voltage curve or the measured current curve deviates from the stored voltage curve or current curve by more than a specified value, the actuator 1 is identified as defective. If the actuator 1 is identified as defective, the actuator 1 is rejected and not processed further.

The invention claimed is:

1. A method for producing electrical contacting of a piezoelectric actuator and for polarizing the piezoelectric actuator, the method comprising:
   providing an actuator having at least one piezoceramic layer which has two spaced electric contacts,
   soldering electric conductors to the electric contacts,
   heating the piezoelectric actuator up to a soldering temperature during the soldering process, wherein during the soldering process a polarizing voltage is applied to the conductors and the piezoceramic layer is polarized.

2. A method according to claim 1, wherein a solder material is used whose soldering temperature is above the Curie temperature of the piezoceramic layer.

3. A method according to claim 1, wherein the polarizing voltage is also applied during a cooling process, and the voltage is limited to a maximum value during cooling of the actuator.

4. A method according to claim 1, wherein the polarizing voltage is applied during a heating process before a maximum temperature is reached, and the current is limited to a maximum value during heating of the actuator.

5. A method according to claim 1, wherein the voltage present during polarization is recorded and evaluated in order to assess the polarization and/or the actuator.

6. A method according to claim 1, wherein the current flowing during polarization is recorded and evaluated in order to assess the polarization and/or the actuator.

7. A method according to claim 1, wherein the conductors are pressed onto soldering surfaces of the contacts via heating blocks, and wherein the heating blocks at least partially heat up the actuator.

8. A method according to claim 1, wherein a plurality of actuators are soldered to conductors and polarized simultaneously.

9. A method according to claim 8, wherein the conductors of a contact are used monolithically for a plurality of actuators during soldering and polarization, and wherein after soldering and polarization the conductors are divided into individual conductor pieces for each actuator.

10. A method according to claim 9, wherein the conductors are connected to contact pins prior to soldering and polarization.

11. A method according to claim 1, wherein the actuator is heated up to above the Curie temperature of the piezoceramic layer during the soldering process.

12. A method for producing electrical contacting of a piezoelectric actuator and for polarizing the piezoelectric actuator, the method comprising:
    providing an actuator comprising a piezoceramic layer with two spaced electric contacts,
    heating the piezoelectric actuator up to a soldering temperature during the soldering process for soldering electric conductors to the electric contacts, wherein during the heating process a polarizing voltage is applied to the conductors.

13. A method according to claim 12, wherein a solder material is used whose soldering temperature is above the Curie temperature of the piezoceramic layer.

14. A method according to claim 12, wherein the polarizing voltage is also applied during a cooling process, and the voltage is limited to a maximum value during cooling of the actuator.

15. A method according to claim 12, wherein the polarizing voltage is applied during a heating process before a maximum temperature is reached, and the current is limited to a maximum value during heating of the actuator.

16. A method according to claim 12, wherein the voltage present during polarization is recorded and evaluated in order to assess the polarization and/or the actuator.

17. A method according to claim 12, wherein the current flowing during polarization is recorded and evaluated in order to assess the polarization and/or the actuator.

18. A method according to claim 12, wherein the conductors are pressed onto soldering surfaces of the contacts via heating blocks, and the heating blocks at least partially heat up the actuator.

19. A method according to claim 12, wherein a plurality of actuators are soldered to conductors and polarized simultaneously.

20. A method for producing electrical contacting of a piezoelectric actuator and for polarizing the piezoelectric actuator, the method comprising:
    providing an actuator comprising a piezoceramic layer with two spaced electric contacts, heating the piezoelectric actuator up to a soldering temperature during the soldering process for soldering electric conductors to the electric contacts, wherein during the heating process a polarizing voltage is applied to the conductors, and applying the polarizing voltage also during a cooling process, and limiting the voltage to a maximum value during cooling of the actuator.

\* \* \* \* \*